United States Patent
Tseng et al.

(10) Patent No.: US 9,223,206 B2
(45) Date of Patent: *Dec. 29, 2015

(54) PHOTOSENSITIVE RESIN COMPOSITION AND APPLICATIONS OF THE SAME

(71) Applicant: CHI MEI CORPORATION, Tainan (TW)

(72) Inventors: Ching-Yuan Tseng, Jhongli (TW); Hao-Wei Liao, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/798,541

(22) Filed: Mar. 13, 2013

(65) Prior Publication Data

US 2013/0277627 A1 Oct. 24, 2013

(30) Foreign Application Priority Data

Apr. 20, 2012 (TW) .............................. 101114141 A

(51) Int. Cl.
| | | |
|---|---|---|
| *G02B 5/23* | (2006.01) | |
| *G03F 7/00* | (2006.01) | |
| *G03F 7/004* | (2006.01) | |
| *G02B 1/04* | (2006.01) | |
| *G03F 7/027* | (2006.01) | |
| *G03F 7/038* | (2006.01) | |
| *G03F 7/075* | (2006.01) | |
| *G02B 5/22* | (2006.01) | |
| *G03C 1/00* | (2006.01) | |

(52) U.S. Cl.
CPC *G03F 7/004* (2013.01); *G02B 1/04* (2013.01); *G03F 7/0007* (2013.01); *G03F 7/027* (2013.01); *G03F 7/0388* (2013.01); *G03F 7/0757* (2013.01)

(58) Field of Classification Search
USPC ........ 252/586; 359/891; 428/447; 430/270.1, 430/280.1, 7, 280, 321; 522/6, 27, 48, 49, 522/59, 99
See application file for complete search history.

(56) References Cited

U.S. PATENT DOCUMENTS

| | | | |
|---|---|---|---|
| 7,449,281 B2 | 11/2008 | Lee | |
| 7,629,086 B2 * | 12/2009 | Otaki et al. | ....................... 430/1 |
| 2008/0220372 A1 * | 9/2008 | Lee et al. | ................... 430/281.1 |
| 2010/0101843 A1 * | 4/2010 | Wakabayashi et al. | ........ 174/258 |
| 2013/0135763 A1 * | 5/2013 | Liao et al. | ...................... 359/891 |

FOREIGN PATENT DOCUMENTS

| | | | | |
|---|---|---|---|---|
| JP | 2008-107529 | * | 5/2008 | .............. G03F 7/075 |
| JP | 2008-116493 | * | 5/2008 | .............. G03F 7/075 |

* cited by examiner

Primary Examiner — Bijan Ahvazi
(74) Attorney, Agent, or Firm — Jianq Chyun IP Office

(57) ABSTRACT

A photosensitive resin composition includes (A) an alkali-soluble resin, (B) a polysiloxane, (C) an ethylenically unsaturated compound, (D) a photo-initiator, (E) a solvent, (F) a black pigment, and (G) a metal chelate. The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization.

12 Claims, No Drawings

PHOTOSENSITIVE RESIN COMPOSITION AND APPLICATIONS OF THE SAME

CROSS-REFERENCE TO RELATED APPLICATION

This application claims priority of Taiwanese Application No. 101114141, filed on Apr. 20, 2012.

BACKGROUND OF THE INVENTION

1. Field of the Invention

This invention relates to a photosensitive resin composition, more particularly to a photosensitive resin composition for a black matrix of a color filter. This invention also relates to a black matrix formed from the photosensitive resin composition, a color filter including the black matrix, and a liquid crystal display device including the color filter.

2. Description of the Related Art

In order to enhance contrast ratio and display quality of a liquid crystal display device, a black matrix is usually disposed in gaps formed among stripes or dots of a color filter so as to avoid reduction of the contrast ratio and color purity due to light leakage among the pixels. Conventionally, a vapor deposited film containing chromium or chromium oxide is used for forming the black matrix. However, there are problems of complicated process, costly material, etc. Therefore, it has been proposed to form the black matrix using a photosensitive resin composition via photo lithographic technology.

U.S. Pat. No. 7,449,281 B2 discloses a photosensitive resin composition used for forming a black matrix. The photosensitive resin composition includes an alkali-soluble resin, an ethylenically unsaturated compound, a photo-initiator, a solvent, and a black pigment. The coating uniformity and the sensitivity of the photosensitive resin composition as well as the heat resistance of the black matrix are enhanced. This is done by application of the alkali-soluble resin along with adjustment and monitoring of viscosity and solid content of the composition, and vapor pressure of the solvent.

Nevertheless, the photosensitive resin composition is susceptible to environmental factors such as temperature and tends to deteriorate while in storage. Moreover, the black matrix is often used in portable display devices which are usually operated at outdoor environment by users. High temperature caused by sunlight might result in deteriorated adhesion of the black matrix. The imaging quality of the portable display devices is therefore lowered.

In view of the aforesaid, it is desirable in the art to provide a black matrix having superior adhesion after heating and to provide a photosensitive resin composition with superior ageing stability for forming the black matrix.

SUMMARY OF THE INVENTION

Therefore, a first object of the present invention is to provide a photosensitive resin composition with superior ageing stability.

A second object of the present invention is to provide a black matrix with superior adhesion after heating.

A third object of the present invention is to provide a color filter including the black matrix.

A fourth object of the present invention is to provide a liquid crystal display device including the color filter.

According to a first aspect of this invention, there is provided a photosensitive resin composition including an alkali-soluble resin (A), a polysiloxane (B), an ethylenically unsaturated compound (C), a photo-initiator (D), a solvent (E), a black pigment (F), and a metal chelate (G). The alkali-soluble resin (A) includes an unsaturated-group-containing resin (A-1) obtained by subjecting a mixture containing an epoxy compound (i) having at least two epoxy groups and a compound (ii) having at least one carboxyl group and at least one ethylenically unsaturated group to polymerization.

According to a second aspect of this invention, there is provided a black matrix formed from the photosensitive resin composition. The black matrix thus formed has a superior adhesion after heating.

According to a third aspect of this invention, there is provided a color filter including the black matrix.

According to a fourth aspect of this invention, there is provided a liquid crystal display device including the color filter.

DETAILED DESCRIPTION OF THE PREFERRED EMBODIMENTS

As used herein, the term "(meth)acrylic acid" means acrylic acid and/or methacrylic acid. Likewise, the term "(meth)acrylate" means acrylate and/or methacrylate.

The photosensitive resin composition of the present invention includes (A) an alkali-soluble resin, (B) a polysiloxane, (C) an ethylenically unsaturated compound, (D) a photo-initiator, (E) a solvent, (F) a black pigment, and (G) a metal chelate. The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization.

Photosensitive Resin Composition and Preparation Thereof:

The photosensitive resin composition of the present invention can be made by mixing the alkali-soluble resin (A), the polysiloxane (B), the ethylenically unsaturated compound (C), the photo-initiator (D), the solvent (E), the black pigment (F), the metal chelate (G), and optional additives (H) using any of the mixing manners commonly used in the art (for example, using a mixer or a dispersing device) to form a liquid dispersion.

Detailed descriptions of the alkali-soluble resin (A), the polysiloxane (B), the ethylenically unsaturated compound (C), the photo-initiator (D), the solvent (E), the black pigment (F), the metal chelate (G), and the additives (H) are stated as follows.

(A) Alkali-Soluble Resin:

The alkali-soluble resin (A) includes the unsaturated-group-containing resin (A-1).

The unsaturated-group-containing resin (A-1) is used in an amount ranging from 30 to 100 parts by weight, preferably from 50 to 100 parts by weight, and more preferably from 70 to 100 parts by weight, based on 100 parts by weight of the alkali-soluble resin (A). The alkali-soluble resin (A) can optionally include (A-2) another alkali-soluble resin (which will be described in detail hereinafter) other than the unsaturated-group-containing resin (A-1).

When the photosensitive resin composition does not contain the unsaturated-group-containing resin (A-1), the black matrix formed therefrom has deteriorated adhesion after heating.

(A-1) Unsaturated-Group-Containing Resin:

The unsaturated-group-containing resin (A-1) is obtained by subjecting a mixture containing (i) an epoxy compound having at least two epoxy groups and (ii) a compound having at least one carboxyl group and at least one ethylenically unsaturated group to polymerization. Preferably, the mixture can further contain (iii) an anhydride compound and/or (iv) an epoxy compound other than the epoxy compound (i).

Preferably, the epoxy compound (i) is represented by formula (I):

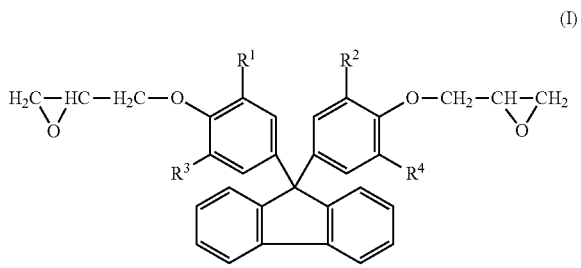

(I)

wherein $R^1$, $R^2$, $R^3$, and $R^4$ are independently selected from the group consisting of hydrogen, halogen, a $C_1$-$C_5$ alkyl group, a $C_1$-$C_5$ alkoxy group, a $C_6$-$C_{12}$ aryl group, and a $C_6$-$C_{12}$ aralkyl group.

Examples of the epoxy compound (i) of formula (I) include, but are not limited to, epoxy-containing bisphenol fluorene, which is obtained by subjecting 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, or the like and epihalohydrin to a reaction. Examples of the epihalohydrin include, but are not limited to, epichlorohydrin and epibromohydrin. Commercially available examples of the epoxy-containing bisphenol fluorene include, but are not limited to, (1) ESF-300, and the like manufactured by Nippon Steel Chemical Group; (2) PG-100, EG-210, and the like manufactured by Osaka Gas; and (3) SMS-F9PhPG, SMS-F9CrG, SMS-F914PG, and the like manufactured by S.M.S. Technology Co.

Preferably, the epoxy compound (i) is represented by formula (II):

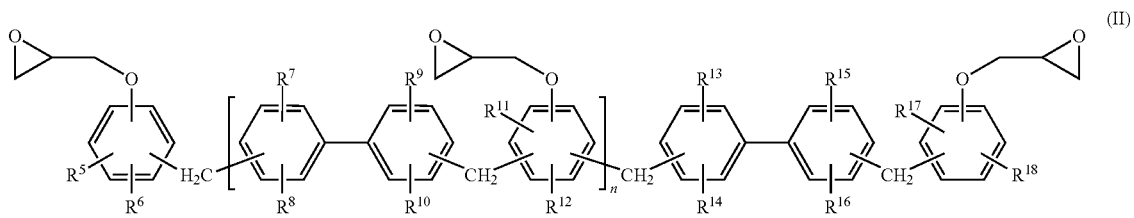

(II)

wherein $R^5$-$R^{18}$ are independently selected from the group consisting of hydrogen, halogen, a $C_1$-$C_8$ alkyl group, and a $C_6$-$C_{15}$ aryl group; and n represents an integer ranging from 0 to 10.

Preferably, the epoxy compound (i) represented by formula (II) is obtained by subjecting a compound represented by formula (II-1) and epihalohydrin to a reaction in the presence of alkali metal hydroxide.

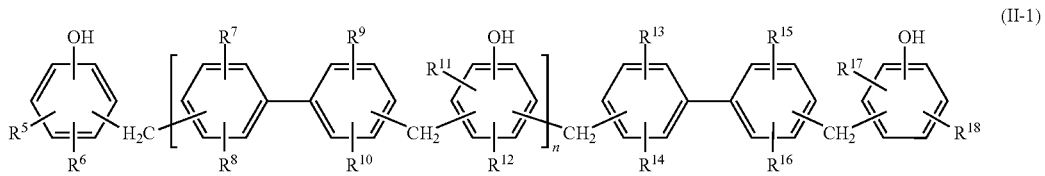

(II-1)

wherein $R^5$-$R^{18}$ and n are as defined in formula (II).

Preferably, the epoxy compound (i) represented by formula (II) is obtained by subjecting a compound represented by formula (II-2) and a phenol compound to a condensation reaction in the presence of an acid catalyst to form the compound represented by formula (II-1), followed by adding an excess amount of epihalohydrin to conduct a dehydrohalogenation reaction.

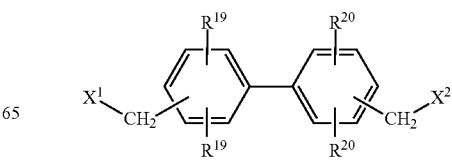

(II-2)

wherein $R^{19}$ and $R^{20}$ are independently selected from the group consisting of hydrogen, halogen, a $C_1$-$C_8$ alkyl group, and a $C_6$-$C_{15}$ aryl group; and $X^1$ and $X^2$ are independently selected from the group consisting of halogen (for example, chlorine or bromine), a $C_1$-$C_6$ alkyl group (for example, methyl, ethyl, or t-butyl), and a $C_1$-$C_6$ alkoxy group (for example, methoxy or ethoxy).

Examples of the phenol compound include, but are not limited to, phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethynylphenol, cyclopentylphenol, cyclohexylphenol, and cyclohexylcresol. The aforesaid examples of the phenol compound can be used alone or in combinations thereof.

The phenol compound is in an amount ranging preferably from 0.5 to 20 moles and more preferably from 2 to 15 moles based on 1 mole of the compound represented by formula (II-2).

Examples of the acid catalyst include, but are not limited to, hydrochloric acid, sulfuric acid, p-toluenesulfonic acid, oxalic acid, boron trifluoride, aluminium chloride anhydrous, and zinc chloride. Preferably, the acid catalyst is p-toluenesulfonic acid, sulfuric acid, or hydrochloric acid. The aforesaid examples of the acid catalyst can be used alone or in combinations thereof. There is no specific limitation to the amount of the acid catalyst. Preferably, the acid catalyst is used in an amount ranging from 0.1 to 30 wt % based on 100 wt % of the compound represented by formula (II-2).

The condensation reaction can be conducted in the absence of solvent or in the presence of organic solvent. Examples of the organic solvent include, but are not limited to, toluene, xylene, and methyl isobutyl ketone. The aforesaid examples of the organic solvent can be used alone or in combinations thereof. The organic solvent is used in an amount ranging preferably from 50 wt % to 300 wt % and more preferably from 100 wt % to 250 wt % based on 100 wt % of a combination of the compound represented by formula (II-2) and the phenol compound. Preferably, the condensation reaction is conducted at a temperature ranging from 40° C. to 180° C. for a period ranging from 1 to 8 hours.

After the condensation reaction is completed, neutralization or rinsing treatment can be conducted. The neutralization treatment is conducted using a neutralizing agent to adjust the pH value of the solution after the condensation reaction to a range from 3 to 7, preferably from 5 to 7. The neutralizing agent is a basic material, and examples thereof include, but are not limited to, (1) alkali metal hydroxides, such as sodium hydroxide and potassium hydroxide; (2) alkaline earth metal hydroxides, such as calcium hydroxide and magnesium hydroxide; (3) organic amines, such as diethylene triamine, triethylene tetramine, aniline, and phenylene diamine; (4) ammonia and sodium dihydrogen phosphate. The rinsing treatment can be conducted in a commonly used manner. For example, the solution after the condensation reaction is repeatedly extracted using an aqueous solution containing the neutralizing agent. After the neutralization or rinsing treatment is completed, the phenol compound and the solvent remaining in the solution can be removed via heating at reduced pressure and a condensation is conducted to obtain the compound represented by formula (II-1).

The dehydrohalogenation is then conducted using epihalohydrin, for example, epichlorohydrin, epibromohydrin, or a combination thereof. Preferably, alkaline metal hydroxide, such as sodium hydroxide, potassium hydroxide, and the like, can be added prior to or during the dehydrohalogenation. Preferably, the dehydrohalogenation is conducted at a temperature ranging from 20° C. to 120° C. for a period ranging from 1 to 10 hours.

Alkaline metal hydroxide for the dehydrohalogenation can be added in a form of an aqueous solution thereof. In this case, the aqueous solution of alkaline metal hydroxide is continuously added to a reaction system for the dehydrohalogenation, and at the same time, water and epihalohydrin are continuously distilled out of the system at a reduced or normal pressure so as to separate and remove water and to continuously recycle epihalohydrin back to the reaction system.

Dehydrohalogenation is preferably conducted by adding quaternary ammonium salts, such as tetramethyl ammonium chloride, tetramethyl ammonium bromide, trimethyl benzyl ammonium chloride, and the like, as a catalyst in advance and conducting a reaction at a temperature ranging from 50° C. to 150° C. for a period ranging from 1 to 5 hours, followed by adding alkaline metal hydroxide or an aqueous solution thereof and further conducting a reaction at a temperature ranging from 20° C. to 120° C. for a period ranging from 1 to 10 hours.

Epihalohydrin is used in an amount ranging from 1 to 20 moles and preferably from 2 to 10 moles based on 1 equivalent weight of the hydroxyl group contained in the compound represented by formula (II-1). The alkaline metal hydroxide added in dehydrohalogenation is used in an amount ranging from 0.8 to 15 moles and preferably from 0.9 to 11 moles based on 1 equivalent weight of the hydroxyl group contained in the compound represented by formula (II-1).

Additionally, an alcohol (for example, methanol, ethanol, and the like) or an aprotic polar solvent (for example, dimethyl sulfone, dimethyl sulfoxide, and the like) can be added to enhance dehydrohalogenation. When alcohol is used, alcohol is in an amount ranging generally from 2 to 20 wt % and preferably from 4 to 15 wt % based on 100 wt % of epihalohydrin. When the aprotic polar solvent is used, the aprotic polar solvent is in an amount ranging generally from 5 to 100 wt % and preferably from 10 to 90 wt % based on 100 wt % of epihalohydrin.

In order to avoid the presence of unreacted material such as epihalohydrin in the reaction which may affect the physical properties of the epoxy resin thus formed, a further dehydrohalogenation can be conducted by adding a solvent such as toluene, methyl isobutyl ketone, and the like, followed by adding an aqueous solution of alkali metal hydroxide such as sodium hydroxide, potassium hydroxide, and the like. In the further dehydrohalogenation, the alkali metal hydroxide is in an amount ranging preferably from 0.01 to 0.3 mole and more preferably from 0.05 to 0.2 mole based on 1 equivalent weight of the hydroxyl group contained in the compound represented by formula (II-1). Preferably, the further dehydrohalogenation is conducted at a temperature ranging from 50° C. to 120° C. for a period ranging from 0.5 to 2 hours.

After dehydrohalogenation is completed, a filtration or rinsing treatment can be optionally conducted, followed by removing epihalohydrin, alcohol, and the aprotic polar solvent by heating at a temperature ranging from 110° C. to 250° C. and a reduced pressure lower than 1.3 kPa (10 mmHg) so as to obtain the epoxy compound (i) represented by formula (II). Commercial examples of the epoxy compound (i) represented by formula (II) include, but are not limited to, NC-3000, NC-3000H, NC-3000S, and NC-3000P manufactured by Nippon Kayaku.

Preferably, the compound (ii) having at least one carboxyl group and at least one ethylenically unsaturated group is selected from (1) acrylic acid, methacrylic acid, 2-methacryloyloxyethylbutanedioic acid, 2-methacryloyloxybutylbutanedioic acid, 2-methacryloyloxyethyladipic acid, 2-methacryloyloxybutyladipic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropyladipic acid, 2-methacryloyloxybutyladipic acid, 2-methacryloyloxypropyltetrahydrophthalic acid, 2-methacryloyloxypropylphthalic acid, 2-methacryloyloxybutylphthalic acid, and 2-methacryloyloxybutylhydrophthalic acid; (2) a compound obtained by subjecting hydroxyl-containing (meth)acrylate and dicarboxylic acid to a reaction; and (3) a hemiester compound obtained by subjecting hydroxyl-containing (meth)acrylate and carboxylic anhydride to a reaction. Examples of the dicarboxylic acid include, but are not limited to, adipic acid, butanedioic acid, maleic acid, and phthalic acid. Examples of the hydroxyl-containing (meth)acrylate include, but are not limited to, (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, and pentaerythritol trimethacrylate. Examples of the carboxylic anhydride are the same as the examples of the anhydride compound (iii) suitable for making the unsaturated-group-containing resin (A-1).

Examples of the anhydride compound (iii) preferably include, but are not limited to, (1) dicarboxylic anhydride: butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydro phthalic anhydride, chlorendic anhydride, glutaric anhydride, and 1,3-dioxoisobenzofuran-5-carboxylic anhydride; (2) tetracarboxylic anhydride: benzophenone tetracarboxylic dianhydride (abbreviated as BTDA), biphenyl tetracarboxylic dianhydride, and diphenyl ether tetracarboxylic dianhydride.

Preferably, the epoxy compound (iv) is selected from glycidyl methacrylate, 3,4-epoxycyclohexyl methacrylate, unsaturated glycidyl ether, unsaturated epoxy compound, and combinations thereof. Commercial examples of the unsaturated glycidyl ether include, but are not limited to, Denacol EX-111, Denacol EX-121, Denacol EX-141, Denacol EX-145, Denacol EX-146, Denacol EX-171, and Denacol EX-192 manufactured by Nagase Chemtex.

The unsaturated-group-containing resin (A-1) can be obtained by subjecting the epoxy compound (i) represented by formula (I) and the compound (ii) having at least one carboxyl group and at least one ethylenically unsaturated group to polymerization to form a hydroxyl-containing product, followed by adding the anhydride compound (iii) to conduct a further reaction. The anhydride group contained in the anhydride compound (iii) is used in an amount ranging preferably from 0.4 to 1 equivalent weight and more preferably from 0.75 to 1 equivalent weight based on 1 equivalent weight of the hydroxyl group contained in the hydroxyl-containing product. When a plurality of the anhydride compounds (iii) are used, they can be added sequentially or simultaneously. When the dicarboxylic anhydride and the tetracarboxylic anhydride are used as the anhydride compound (iii), the molar ratio of the dicarboxylic anhydride to the tetracarboxylic anhydride ranges preferably from 1/99 to 90/10 and more preferably from 5/95 to 80/20. The reaction is conducted at a temperature preferably from 50° C. to 130° C.

Alternatively, the unsaturated-group-containing resin (A-1) can be obtained by subjecting the epoxy compound (i) represented by formula (II) and the compound (ii) having at least one carboxyl group and at least one ethylenically unsaturated group to polymerization to form a hydroxyl-containing product, followed by adding the anhydride compound (iii) and/or the epoxy compound (iv) to conduct a further polymerization reaction. The acid value of the compound (ii) is used in an amount ranging preferably from 0.8 to 1.5 equivalent weight and more preferably from 0.9 to 1.1 equivalent weight based on 1 equivalent weight of the epoxy group contained in the epoxy compound (i) represented by formula (II). The anhydride compound (iii) is in an amount ranging generally from 10 mole % to 100 mole %, preferably from 20 mole % to 100 mole %, and more preferably from 30 mole % to 100 mole % based on 100 mole % of the hydroxyl group contained in the hydroxyl-containing product.

In order to enhance the reaction for making the unsaturated-group-containing resin (A-1), a basic compound may be added as a catalyst for the reaction. Examples of the catalyst include, but are not limited to, triphenyl phosphine, triphenyl stibine, triethylamine, triethanolamine, tetramethylammonium chloride, and benzyltriethylammonium chloride. The examples of the catalyst can be used alone or in combinations thereof. The catalyst is in an amount ranging preferably from 0.01 to 10 parts by weight and more preferably from 0.3 to 5 parts by weight based on 100 parts by weight of a combination of the epoxy compound (i) and the compound (ii).

Additionally, a polymerization inhibitor can be added to control the degree of polymerization. Examples of the polymerization inhibitor include, but are not limited to, methoxyphenol, methylhydroquinone, hydroquinone, 2,6-di-t-butyl-p-cresol, and phenothiazine. The examples of the polymerization inhibitor can be used alone or in combinations thereof. The polymerization inhibitor is in an amount ranging preferably from 0.01 to 10 parts by weight and more preferably from 0.1 to 5 parts by weight based on 100 parts by weight of a combination of the epoxy compound (i) and the compound (ii).

A polymerization solvent can be used for making the unsaturated-group-containing resin (A-1), if desired. Examples of the polymerization solvent include, but are not limited to, (1) alcohols: ethanol, propanol, iso-propanol, butanol, iso-butanol, 2-butanol, hexanol, ethylene glycol, and the like; (2) ketones: methyl ethyl ketone, cyclohexyl ketone, and the like; (3) aromatic hydrocarbons: toluene, xylene, and the like; (4) cellosolve compounds: cellosolve, butyl cellosolve, and the like; (5) carbitol compounds: carbitol, butylcarbitol, and the like; (6) propylene glycol alkyl ethers: propylene glycol methyl ether, and the like; (7) poly(propylene glycol) alkyl ethers: di(propylene glycol) methyl ether, and the like; (8) acetates: ethyl acetate, butyl acetate, ethylene glycol monoethyl ether acetate, propylene glycol monomethyl ether acetate, and the like; (9) lactates: ethyl lactate, butyl lactate, and the like; and (10) dialkyl glycol ethers. The aforesaid examples of the polymerization solvent can be used alone or in combinations thereof.

The acid value of the unsaturated-group-containing resin (A-1) ranges preferably from 50 to 200 mgKOH/g, and more preferably from 60 to 150 mgKOH/g.

(A-2) Other Alkali-Soluble Resin:

In addition to the aforesaid alkali-soluble resin (A-1), the alkali-soluble resin (A) may include another alkali-soluble resin (A-2) different from the unsaturated-group-containing resin (A-1). The alkali-soluble resin (A-2) is used in an amount ranging generally from 0 to 70 parts by weight, preferably from 0 to 50 parts by weight, and more preferably from 0 to 30 parts by weight based on 100 parts by weight of the alkali-soluble resin (A).

Examples of the alkali-soluble resin (A-2) include, but are not limited to, resins containing at least one carboxylic or hydroxyl group, such as acrylic resins other than the unsaturated-group-containing resin (A-1), urethane resins, and novolac resins.

(B) Polysiloxane:

The polysiloxane (B) is used in an amount ranging generally from 5 to 150 parts by weight, preferably from 10 to 140 parts by weight, and more preferably from 20 to 120 parts by weight based on 100 parts by weight of the alkali-soluble resin (A).

When the polysiloxane (B) is not used in the photosensitive resin composition, the black matrix formed from the photosensitive resin composition has inferior adhesion after heating.

There is no specific limitation to the structure of the polysiloxane (B). Preferably, the polysiloxane (B) is obtained by subjecting a silane monomer, a siloxane prepolymer, or a combination of a silane monomer and a siloxane prepolymer to conduct hydrolysis and partial condensation.

The silane monomer is preferably represented by Formula (IV):

$(R^{21})_m Si(OR^{22})_{4-m}$ (IV).

m is an integer ranging from 0 to 3.

$R^{21}$ represents hydrogen, a substituted or unsubstituted $C_1$-$C_{10}$ alkyl group, a substituted or unsubstituted $C_2$-$C_{10}$ alkenyl group, or a substituted or unsubstituted $C_6$-$C_{15}$ aryl group. A plurality of $R^{21}$s are the same or different when m is 2 or 3. Examples of the alkyl group include, but are not limited to, methyl, ethyl, n-propyl, isopropyl, n-butyl, tert-butyl, n-hexyl, n-decyl, trifluoromethyl, 3,3,3-trifluoropropyl, 3-glycidoxy, 2-(3,4-epoxycyclohexyl)ethyl, 3-aminopropyl, 3-mercaptopropyl, 3-isocyanatopropyl, 2-oxetanylbutoxypropyl, 3-glutaric anhydride propyl, 3-butanedioic anhydride propyl, and 2-butanedioic anhydride ethyl. Examples of the alkenyl group include, but are not limited to, vinyl, 3-acryloyloxypropyl, and 3-methacryloyloxypropyl. Examples of the aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy) pentyl, and naphthyl.

$R^{22}$ represents hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. A plurality of $R^{22}$s are the same or different when 4-m is 2, 3, or 4. Examples of the alkyl group include, but are not limited to, methyl, ethyl, n-propyl, isopropyl, and n-butyl. A non-limiting example of the acyl group is acetyl. A non-limiting example of the aryl group is phenyl.

When m is 0, the silane monomer is tetrafunctional silane. When m is 1, the silane monomer is trifunctional silane. When m is 2, the silane monomer is difunctional silane. When m is 3, the silane monomer is monofunctional silane.

Examples of the silane monomer include, but are not limited to, (1) tetrafunctional silane: tetramethoxysilane, tetraethoxysilane, tetraacetoxysilane, tetraphenoxysilane, and the like; (2) trifunctional silane: methyltrimethoxysilane (abbreviated as MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloyloxypropyltrimethoxysilane, 3-acryloyloxypropyltriethoxysilane, 3-methacryloyloxypropyltrimethoxysilane, 3-methacryloyloxypropyltriethoxysilane, phenyltrimethoxysilane (abbreviated as PTMS), phenyltriethoxysilane (abbreviated as PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 2-oxetanylbutoxypropyltriphenoxysilane, commercially available 2-oxetanylbutoxypropyltrimethoxysilane manufactured by Toagosei (trade name: TMSOX), commercially available 2-oxetanylbutoxypropyltriethoxysilane manufactured by Toagosei (trade name: TESOX), 2-trimethoxysilylethyl butanedioic anhydride, 3-triphenoxysilylpropyl butanedioic anhydride, commercially available 3-trimethoxysilylpropyl butanedioic anhydride manufactured by Shin-Etsu (trade name: X-12-967), commercially available 3-triethoxysilylpropyl butanedioic anhydride manufactured by WACKER (trade name: GF-20), 3-trimethoxysilylpropyl glutaric anhydride (abbreviated as TMSG), 3-triethoxysilylpropyl glutaric anhydride, 3-triphenoxysilylpropyl glutaric anhydride, and the like; (3) difunctional silane: dimethyldimethoxysilane (abbreviated as DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (abbreviated as DIDOS), di(3-oxetanylpentyl)dimethoxysilane, di-[(2-butanedioic anhydride)propyl]di-n-butoxysilane, di-[(2-butanedioic anhydride)ethyl]dimethoxysilane, and the like; and (4) monofunctional silane: trimethylmethoxysilane, tri-n-butylethoxysilane, 3-glycidoxydimethylmethoxysilane, 3-glycidoxydimethylethoxysilane, tri-[(2-butanedioic anhydride)propyl]phenoxysilane, di-[(2-butanedioic anhydride) ethyl](methyl)methoxysilane, and the like. The aforesaid examples of the silane monomer can be used alone or in combinations thereof.

The siloxane prepolymer is preferably represented by Formula (V):

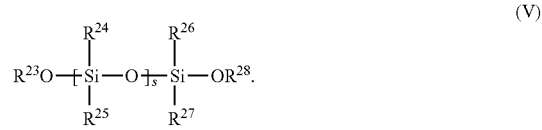

(V)

s is an integer ranging preferably from 1 to 1,000 and more preferably from 5 to 200.

$R^{24}$-$R^{27}$ respectively represent hydrogen, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. A plurality of $R^{24}$s are the same or different and a plurality of $R^{25}$s are the same or different when s is from 2 to 1,000. Examples of the alkyl group include, but are not limited to, methyl, ethyl, and n-propyl. Examples of the alkenyl group include, but are not limited to, vinyl, acryloyloxypropyl, and methacryloyloxypropyl. Examples of the aryl group include, but are not limited to, phenyl, tolyl, and naphthyl.

$R^{23}$ and $R^{28}$ respectively represent hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, and n-butyl. A non-limiting example of the acyl group is acetyl. A non-limiting example of the aryl group is phenyl.

Examples of the siloxane prepolymer include, but are not limited to, 1,1,3,3-tetramethyl-1,3-dimethoxydisiloxane, 1,1,3,3-tetraethyl-1,3-diethoxydisiloxane, and commercially available silanol-terminated polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or in combinations thereof.

When the silane monomer and the siloxane prepolymer are used in combination, there is no specific limitation to the mixing ratio thereof. Preferably, the molar ratio of the Si atom of the silane monomer to that of the siloxane prepolymer ranges from 100:0.01 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 to 250 nm, preferably from 5 to 200 nm, and more preferably from 10 to 100 nm.

Examples of the silicon dioxide particles include commercially available products manufactured by Catalysts and Chemicals Ltd., for example, OSCAR 1132 (particle size: 12 nm, dispersing agent: methanol), OSCAR 1332 (particle size: 12 nm, dispersing agent: n-propanol), OSCAR 105 (particle size: 60 nm, dispersing agent: γ-butyrolactone), OSCAR 106 (particle size: 120 nm, dispersing agent: diacetone alcohol), and the like; commercially available products manufactured by Fuso Chemical Co., Ltd., for example, Quartron PL-1-IPA (particle size: 13 nm, dispersing agent: isopropanone), Quartron PL-1-TOL (particle size: 13 nm, dispersing agent: phenol), Quartron PL-2L-PGME (particle size: 18 nm, dispersing agent: propylene glycol monomethyl ether), Quartron PL-2L-MEK (particle size: 18 nm, dispersing agent: methyl ethyl ketone), and the like; commercially available products manufactured Nissan Chemical, for example, IPA-ST (particle size: 12 nm, dispersing agent: isopropanol), EG-ST (particle size: 12 nm, dispersing agent: ethylene glycol), IPA-ST-L (particle size: 45 nm, dispersing agent: isopropanol), IPA-ST-ZL (particle size: 100 nm, dispersing agent: isopropanol), and the like. The aforesaid examples of the silicon dioxide particles can be used alone or in combinations thereof.

When the silicon dioxide particles are mixed with the silane monomer and/or the siloxane prepolymer, there is no specific limitation to the amounts thereof. Preferably, the molar ratio of the Si atom of the silicon dioxide particles to that of the silane monomer and/or the siloxane prepolymer ranges from 1% to 50%.

The hydrolysis and the partial condensation can be conducted in a manner well known in the art. For example, the mixture of the silane monomer and/or the siloxane prepolymer and/or the silicon dioxide particles is added with solvent, water, and optionally catalyst, followed by stirring at a temperature ranging from 50° C. to 150° C. for 0.5 to 120 hours. The by-products, such as alcohols, water, and the like, can be removed by distillation if necessary.

There is no specific limitation to the solvent, which can be the same as or different from the solvent (E) contained in the photosensitive resin composition. Preferably, the solvent is added in an amount ranging generally from 15 to 1200 g, preferably from 20 to 1100 g, and more preferably from 30 to 1000 g based on 100 g of a combination of the silane monomer and the siloxane prepolymer.

The amount of water for the hydrolysis ranges from 0.5 to 2 moles based on 1 mole of the hydrolysable groups contained in the mixture.

There is no specific limitation to the catalyst. Preferably, the examples of the catalyst include acidic catalyst, for example, hydrochloric acid, nitric acid, sulfuric acid, hydrofluoric acid, oxalic acid, phosphoric acid, acetic acid, trifluoroacetic acid, formic acid, polycarboxylic acid and anhydride thereof, ionic exchange resin, and the like; and basic catalyst, for example, diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilane containing an amino group, ionic exchange resin, and the like.

Preferably, the catalyst is added in an amount ranging generally from 0.005 to 15 g, preferably from 0.01 to 12 g, and more preferably from 0.05 to 10 g based on 100 g of a combination of the silane monomer and the siloxane prepolymer.

In view of safety, it is preferable that the by-products (for example, alcohols or water) and the catalyst are not contained in the polysiloxane (B) produced by the hydrolysis and the partial condensation. Therefore, it is preferable to purify the polysiloxane (B). There is no specific limitation to the purification method. Preferably, the polysiloxane (B) is diluted with hydrophobic solvent, and the separated organic layer is washed several times with water and is then condensed with an evaporator to remove alcohols and water. Alternatively, the catalyst can be removed using ion exchange resin.

A weight ratio of the unsaturated-group-containing resin (A-1) to the polysiloxane (B) ranges from 0.8 to 10.0, preferably from 1.0 to 9.5, and more preferably from 1.5 to 9.0. The black matrix made from the photosensitive resin composition has superior adhesion after heating when the weight ratio of the unsaturated-group-containing resin (A-1) to the polysiloxane (B) ranges from 0.8 to 10.0.

(C)Ethylenically Unsaturated Compound:

The ethylenically unsaturated compound (C) is in an amount ranging generally from 5 to 220 parts by weight, preferably from 10 to 200 parts by weight, and more preferably from 15 to 180 parts by weight based on 100 parts by weight of the alkali-soluble resin (A).

Preferably, the ethylenically unsaturated compound (C) is selected from (C-1) a compound having one ethylenically unsaturated group, and (C-2) a compound having two or more ethylenically unsaturated groups.

Examples of the compound (C-1) include, but are not limited to, acrylamide, (meth)acryloyl morpholine, 7-amino-3,7-dimethyl octyl(meth)acrylate, iso-butoxy methyl(meth)acrylamide, iso-bornyloxyethyl(meth)acrylate, iso-bornyl (meth)acrylate, 2-ethylhexyl(meth)acrylate, ethyl diethylene glycol(meth)acrylate, t-octyl(meth)acrylamide, diacetone (meth)acrylamide, dimethyl aminoethyl(meth)acrylate, dodecyl(meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl(meth)acrylate, 2-trichlorophenoxy ethyl(meth)acrylate, tribromophenyl(meth)acrylate, 2-tribromophenoxyethyl(meth)acrylate, 2-hydroxyethyl (meth)acrylate, 2-hydroxypropyl(meth)acrylate, vinyl caprolactam, N-vinyl pyrrolidone, phenoxy ethyl(meth)acrylate, pentachlorophenyl(meth)acrylate, pentabromophenyl(meth) acrylate, polyethylene glycol mono(meth)acrylate, polypropylene glycol mono(meth)acrylate, and bornyl(meth)acrylate. The aforesaid examples of the compound (C-1) can be used alone or in admixture of two or more.

Examples of the compound (C-2) include, but are not limited to, ethylene glycol di(meth)acrylate, dicyclopentenyl di(meth)acrylate, tetraethylene glycol di(meth)acrylate, tetraethylene glycol di(meth)acrylate, tri(2-hydroxyethyl)isocyanurate di(meth)acrylate, tri(2-hydroxyethyl)isocyanurate tri(meth)acrylate, caprolactone-modified tri(2-hydroxyethyl) isocyanurate tri(meth)acrylate, trimethylolpropyl tri(meth) acrylate, ethylene oxide (hereinafter abbreviated as EO) modified trimethylolpropyl tri(meth)acrylate, propylene oxide (hereinafter abbreviated as PO) modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)acrylate, pentaerythritol tetra(meth) acrylate, polyester di(meth)acrylate, polyethylene glycol di(meth)acrylate, dipentaerythritol hexa(meth)acrylate, dipentaerythritol penta(meth)acrylate, dipentaerythritol tetra (meth)acrylate, caprolactone-modified dipentaerythritol hexa(meth)acrylate, caprolactone-modified dipentaerythritol penta(meth)acrylate, di(trimethylolpropane) tetra(meth) acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, and phenol novolac polyglycidyl ether (meth)acrylate. The aforesaid examples of the compound (C-2) can be used alone or in admixture of two or more.

Preferably, the ethylenically unsaturated compound (C) is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, and combinations thereof.

(D) Photo-Initiator:

The photo-initiator (D) is used in an amount ranging generally from 2 to 120 parts by weight, more preferably from 5 to 70 parts by weight, and most preferably from 10 to 60 parts by weight based on 100 parts by weight of the ethylenically unsaturated compound (C).

Examples of the photo-initiator (D) suitable for the present invention include, but are not limited to, oxime compounds (D-1), acetophenone compounds (D-2), other photo-initiators (D-3), and combinations thereof.

Examples of the oxime compounds (D-1) include, but are not limited to, ethanone, 1-[9-ethyl-6-(2-methylbenzoyl)$_9$H-carbazole-3-yl]-1-(O-acetyl oxime) (for example, OXE02 manufactured by Ciba Specialty Chemicals), ethanone, 1-[9-ethyl-6-(2-chloro-4-benzylsulfonyl benzoyl)9H-carbazole-3-yl]-1-(O-acetyl oxime) (manufactured by Asahi Denka Co., Ltd.), 1-(4-phenyl-thiophenyl)-butane-1,2-dione 2-oxime-O-benzoate, 1-(4-phenyl-thiophenyl)-octane-1,2-dione 2-oxime-O-benzoate (for example, OXE01 manufactured by Ciba Specialty Chemicals), 1-(4-phenyl-thiophenyl)-octane-1-one oxime-O-acetate, and 1-(4-phenyl-thiophenyl)-butane-1-one oxime-O-acetate. The aforesaid examples of the oxime compounds (D-1) can be used alone or in combinations thereof.

Examples of the acetophenone compounds (D-2) include, but are not limited to, p-dimethylaminoacetophenone, α,α'-dimethoxyazoacetophenone, 2,2'-dimethyl-2-phenylacetophenone, p-methoxyacetophenone, 2-methyl-1-(4-methylthiophenyl)-2-morpholino-1-propan one, and 2-benzyl-2-N,N-dimethylamino-1-(4-morpholinophenyl)-1-butanone. The aforesaid examples of the acetophenone compounds (D-2) can be used alone or in combinations thereof. Preferably, the acetophenone compound (D-2) is selected from 2-methyl-1-(4-methylthiophenyl)-2-morpholino-1-propan one and 2-benzyl-2-N,N-dimethylamino-1-(4-morpholinophenyl)-1-butanone.

Examples of other photo-initiators (D-3) include, but are not limited to, (1) biimidazole compounds: 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis (p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2,4-dichlorophenyl)-4,4',5,5'-tetraphenylbiimidazole, and the like; (2) benzophenone compounds: thioxanthone, 2,4-diethylthioxanthone, thioxanthone-4-sulfone, benzophenone, 4,4'-bis(dimethylamino) benzophenone, 4,4'-bis(diethylamino)benzophenone, and the like; (3) α-diketone compounds: benzyl, acetyl, and the like; (4) acyloin compounds: benzoin, and the like; (5) acyloin ether compounds: benzoin methyl ether, benzoin ethyl ether, benzoin isopropyl ether, and the like; (6) acylphosphine oxide compounds: 2,4,6-trimethylbenzoyl diphenylphosphine oxide, bis-(2,6-dimethoxybenzoyl)-2,4,4-trimethyl benzyl phosphine oxide, and the like; (7) quinone compounds: anthraquinone, 1,4-naphthoquinone, and the like; (8) halide compounds, such as phenacyl chloride, tribromomethyl phenylsulfone, tris(trichloromethyl)-s-triazine, and the like; (9) peroxide compounds: di-tert-butyl peroxide, and the like; and (10) any combination of the aforesaid compounds (1)-(9).

(E) Solvent:

The solvent (E) used in this invention is preferably capable of dissolving the alkali-soluble resin (A), the ethylenically unsaturated compound (C), and the photo-initiator (D) and will not interact with these components. The solvent is preferably volatile.

The solvent (E) is used in an amount ranging generally from 500 to 5,000 parts by weight, preferably from 800 to 4,700 parts by weight, and more preferably from 1,000 to 4,500 parts by weight based on 100 parts by weight of the alkali-soluble resin (A).

Examples of the solvent (E) include, but are not limited to, (1) alkylene glycol monoalkyl ether compounds: ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (2) alkylene glycol monoalkyl ether acetate compounds: ethylene glycol monomethyl ether acetate, ethylene glycol monoethyl ether acetate, propylene glycol monomethyl ether acetate, propylene glycol monoethyl ether acetate, and the like; (3) other ether compounds: diethylene glycol dimethyl ether, diethylene glycol methyl ethyl ether, diethylene glycol diethyl ether, tetrahydrofuran, and the like; (4) ketone compounds: methyl ethyl ketone, cyclohexanone, 2-heptanone, 3-heptanone, diacetone alcohol, and the like; (5) alkyl lactate compounds: methyl 2-hydroxypropionate, ethyl 2-hydroxypropionate, and the like; (6) other ester compounds: methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyrutate, ethyl pyrutate, n-propyl pyrutate, methyl acetoacetate, ethyl acetoacetate, ethyl 2-oxybutyrate, and the like; (7) aromatic hydrocarbon compounds: toluene, xylene, and the like; (8) amide compounds: N-methylpyrrolidone, N,N-dimethylformamide, N,N-dimethylacetamide, and the like; and (9) any combination of the aforesaid compounds (1)-(8).

(F) Black Pigment:

The black pigment (F) is used in an amount ranging generally from 50 to 800 parts by weight, preferably from 100 to 750 parts by weight, and more preferably from 150 to 700 parts by weight based on 100 parts by weight of the alkali-soluble resin (A).

The black pigment (F) used in this invention preferably has heat resistivity, light fastness, and solvent resistance. Examples of the black pigment (F) include, but are not limited to, (1) black organic pigments: perylene black, cyanine black, aniline black, and the like; (2) nearly black organic pigments formed by mixing two or more pigments selected from red, blue, green, purple, yellow, cyanine pigments, and the like; (3) light-shielding materials: carbon black, chromium oxide, iron oxide, titanium black, graphite, and the like. A non-limiting example of the carbon black is C.I. pigment black 7. Commercially available examples of the carbon black include, but are not limited to, MA100, MA230, MA8, #970, #1000, #2350, #2650 manufactured by Mitsubishi Chemical Corporation.

(G) Metal Chelate:

The metal chelate (G) is used in an amount ranging generally from 1 to 50 parts by weight, preferably from 2 to 45 parts by weight, and more preferably from 3 to 40 parts by weight based on 100 parts by weight of the alkali-soluble resin (A).

If the metal chelate (G) is not used in the photosensitive resin composition, the photosensitive resin composition has inferior ageing stability and the black matrix formed therefrom has deteriorated adhesion after heating. The metal chelate (G) may react with the polysiloxane (B) so that the black matrix is formed with an intimate structure so as to enhance the heat resistance of the black matrix. Therefore, the adhesion of the black matrix can be maintained even after long-term sunlight exposure.

The metal chelate (G) is represented by formula (III):

$$(R^{29})_p M(OR^{30})_{j-p} \quad (III)$$

wherein
M is a metal;
$R^{29}$ is a chelating ligand;
$R^{30}$ is selected from the group consisting of a $C_2$-$C_5$ alkyl group and a $C_6$-$C_{20}$ aryl group;
j is a valence number of said metal;
p is an integer ranging from 1 to j;
a plurality of $R^{29}$s are the same or different when p is greater than 1; and
a plurality of $R^{30}$s are the same or different when j-p is greater than 1.

Examples of the $C_2$-$C_5$ alkyl group include, but are not limited to, ethyl, propyl, isopropyl, and butyl. A non-limiting example of the $C_6$-$C_{20}$ aryl group is phenyl.

Examples of the metal include, but are not limited to, aluminium, titanium, zirconium, beryllium, calcium, cobalt, copper, iron, hafnium, iridium, palladium, manganese, molybdenum, niobium, nickel, platinum, tin, ruthenium, tantalum, vanadium, tungsten, and zinc. Preferably, the metal is selected from aluminium, titanium, and zirconium.

Preferably, the chelating ligand is selected from the group consisting of a β-diketone type chelating ligand, a β-ketone ester type chelating ligand, an amine type chelating ligand, a sulfonic acid type chelating ligand, and a phosphate type chelating ligand.

Examples of the β-diketone type chelating ligand include, but are not limited to, acetylacetonate, dibenzoylmethane, 2,2,6,6-tetramethyl-3,5-heptanedionate, benzoyl acetonate, 1,3-diphenyl-1,3-propanedionate, tetramethylheptanedionate, hexanedionate, and heptanedionate.

Examples of the β-ketone ester type chelating ligand include, but are not limited to, ethyl acetoacetate, methyl acetoacetate, benzoyl acetoacetate, methacryloxy ethyl acetate, allylacetoacetate, methyl benzoyl acetate, ethyl benzoyl acetate, and benzoyl acetate.

Examples of the amine type chelating ligand include, but are not limited to, triethanolamine and N-aminoethyl aminoethyl.

A non-limiting example of the sulfonic acid type chelating ligand includes dodecylbenzenesulfonic acid.

Examples of the phosphate type chelating ligand include, but are not limited to, dioctyl pyrophosphate, dioctyl phosphate, and tridecyl phosphate.

Examples of the metal chelate (G) include, but are not limited to, (1) aluminum chelate compound: tris(acetylacetonato)aluminum, tris(ethyl acetoacetato)aluminum, (di-i-propoxy)monoacetylacetonato aluminum, (di-i-propoxy) monomethylacetoacetato aluminum, (di-i-propoxy) monoethylacetoacetate aluminum, and bis(ethyl acetoacetato) monoacetylacetonato aluminum; (2) titanium chelate compound: triethoxy monoacetylacetonato titanium, tri-n-propoxy monoacetylacetonato titanium, tri-i-propoxy monoacetylacetonato titanium, di-i-propoxy bisacetylacetonate titanium, di-i-propoxy bis(ethyl acetoacetato) titanium, tri-n-butoxy monoacetylacetonato titanium, tri-sec-butoxy monoacetylacetonato titanium, tri-t-butoxy monoacetylacetonato titanium, diethoxy bisacetylacetonato titanium, di-n-propoxy bisacetylacetonato titanium, di-i-propoxy bisacetylacetonato titanium, di-n-butoxy bisacetylacetonato titanium, di-sec-butoxy bisacetylacetonato titanium, di-t-butoxy bisacetylacetonato titanium, monoethoxy trisacetylacetonato titanium, mono-n-propoxy trisacetylacetonato titanium, mono-i-propoxy trisacetylacetonato titanium, mono-n-butoxy trisacetylacetonato titanium, mono-sec-butoxy trisacetylacetonato titanium, mono-t-butoxy trisacetylacetonato titanium, tetrakis(acetylacetonato) titanium, triethoxy monoethyl acetoacetato titanium, tri-n-propoxy monoethyl acetoacetato titanium, tri-i-propoxy monoethyl acetoacetato titanium, tri-n-butoxy monoethyl acetoacetato titanium, tri-sec-butoxy monoethyl acetoacetato titanium, tri-t-butoxy monoethyl acetoacetato titanium, diethoxy bisethyl acetoacetato titanium, di-n-propoxy bisethyl acetoacetato titanium, di-i-propoxy bisethyl acetoacetato titanium, di-n-butoxy bisethyl acetoacetato titanium, di-sec-butoxy bisethyl acetoacetato titanium, di-t-butoxy bisethyl acetoacetato titanium, monoethoxy trisethyl acetoacetato titanium, mono-n-propoxy trisethyl acetoacetato titanium, mono-i-propoxy trisethyl acetoacetato titanium, mono-n-butoxy trisethyl acetoacetato titanium, mono-sec-butoxy trisethyl acetoacetato titanium, mono-t-butoxy trisethyl acetoacetato titanium, tetrakisethyl acetoacetato titanium, monoacetylacetonato trisethyl acetoacetate titanium, bisacetylacetonate bis ethyl acetoacetato titanium, trisacetylacetonato monoethyl acetoacetate titanium, di-n-propoxy bis(triethanolamine) titanium, di-n-butoxy bis(triethanolamine) titanium, isopropyl tris(dodecylbenzenesulfonyl)titanate, isopropyl tris(dioctyl pyrophosphate) titanate, tetraisopropyl bis(dioctyl phosphate) titanate, tetraoctyl bis(di-tridecyl phosphate) titanate, tetra(2,2-diallyloxymethyl-1-butyl)bis(di-tridecyl)phosphate titanate, bis(dioctyl pyrophosphate)oxyacetate titanate, bis(di-octyl pyrophosphate)ethylene titanate, isopropyl tri (dioctyl phosphate) titanate, and isopropyl tri(N-aminoethyl aminoethyl)titanate; and (3) zirconium chelate compound: triethoxy monoacetylacetonato zirconium, tri-n-propoxy monoacetylacetonato zirconium, tri-i-propoxy monoacetylacetonato zirconium, tri-n-butoxy monoacetylacetonato zirconium, tri-sec-butoxy monoacetylacetonato zirconium, tri-t-butoxy monoacetylacetonato zirconium, diethoxy bisacetylacetonato zirconium, di-n-propoxy bisacetylacetonato zirconium, di-i-propoxy bisacetylacetonato zirconium, di-n-butoxy bisacetylacetonato zirconium, di-sec-butoxy bisacetylacetonato zirconium, di-t-butoxy bisacetylacetonato zirconium, monoethoxy trisacetylacetonato zirconium, mono-n-propoxy trisacetylacetonato zirconium, mono-i-propoxy tris acetylacetonato zirconium, mono-n-butoxy trisacetylacetonato zirconium, mono-sec-butoxy trisacetylacetonato zirconium, mono-t-butoxy trisacetylacetonato zirconium, tetrakisacetylacetonato zirconium, triethoxy monoethyl acetoacetato zirconium, tri-n-propoxy monoethyl acetoacetato zirconium, tri-i-propoxy monoethyl acetoacetato zirconium, tri-n-butoxy monoethyl acetoacetato zirconium, tri-sec-butoxy monoethyl acetoacetato zirconium, tri-t-butoxy monoethyl acetoacetato zirconium, diethoxy bisethyl acetoacetato zirconium, di-n-propoxy bisethyl acetoacetato zirconium, di-i-propoxy bisethyl acetoacetato zirconium, di-n-butoxy bisethyl acetoacetato zirconium, di-sec-butoxy bisethyl acetoacetato zirconium, di-t-butoxy-bisethyl acetoacetato zirconium, monoethoxy trisethyl acetoacetato zirconium, mono-n-propoxy trisethyl acetoacetato zirconium, mono-i-propoxy trisethyl acetoacetato zirconium, mono-n-butoxy trisethyl acetoacetato zirconium, mono-sec-butoxy trisethyl acetoacetato zirconium, mono-t-butoxy-trisethyl acetoacetato zirconium, tetrakisethyl acetoacetato zirconium, monoacetylacetonate trisethyl acetoacetato zirconium, bisacetylacetonate bisethyl acetoacetato zirconium, and trisacetylacetonato monoethyl acetoacetate zirconium. The aforesaid examples of the metal chelate (G) can be used alone or in combinations thereof.

(H) Additive

An additive (H) may be added to the photosensitive resin composition as long as the intended properties of the photosensitive resin composition are not impaired. Examples of the additive (H) include, but are not limited to, surfactant, filler, adhesion promoting agent, bridging agent, antioxidant, UV absorbent, anti-coagulant, and a polymer other than the alkali-soluble resin (A) to enhance properties such as mechanical property.

If used, the filler, the adhesion promoting agent, the antioxidant, the UV absorbent, the anti-coagulant, and the polymer other than the alkali-soluble resin (A) are each used in an amount preferably less than 10 parts by weight and more preferably less than 6 parts by weight based on 100 parts by weight of the alkali-soluble resin (A).

The surfactant is used in an amount preferably less than 6 parts by weight and more preferably less than 4 parts by weight based on 100 parts by weight of the alkali-soluble resin (A).

The bridging agent is used in an amount preferably less than 100 parts by weight and more preferably less than 80 parts by weight based on 100 parts by weight of the alkali-soluble resin (A).

Preferably, the surfactant is selected from a cationic surfactant, an anionic surfactant, a nonionic surfactant, an amphoteric surfactant, a silicone-based surfactant, a fluorine-based surfactant, and combinations thereof. Examples of the surfactant include, but are not limited to, (1) polyoxyethylene alkyl ethers: polyoxyethylene lauryl ether, polyoxyethylene stearyl ether, polyoxyethylene oleyl ether, and the like; (2) polyoxyethylene alkyl phenyl ethers: polyoxyethylene octyl phenyl ether, polyoxyethylene nonyl phenyl ether, and the like; (3) polyethylene glycol dialkyl esters: polyethylene glycol dilaurate, polyethylene glycol distearate, and the like; (4) sorbitan fatty acid esters; (5) fatty acid modified polyesters; and (6) tertiary amine modified polyurethanes. The aforesaid examples of the surfactant can be used alone or in combinations thereof.

Commercially available examples of the surfactant include, but are not limited to, KP manufactured by Shin-Etsu Chemical Industry Co., Ltd., SF-8427 manufactured by Toray Dow Corning Silicon, Polyflow manufactured by Kyoei-Sha Yushi Kagaku Kogyo Co., Ltd., F-Top manufactured by Tochem Product Co., Ltd., Megafac manufactured by Dainippon Chemicals and Ink Co., Ltd., Fluorade manufactured by Sumitomo 3M Co., Ltd., Asahi Guard, Serflon manufactured by Asahi Glass Co., Ltd., and SINOPOL E8008 manufactured by Sino-Japan Chenucal.

Examples of the filler include, but are not limited to, glass and aluminum.

Examples of the adhesion-promoting agent include, but are not limited to, vinyltrimethoxysilane, vinyltriethoxysilane, 3-methacryloyloxypropyltrimethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propyltrimethoxysilane, 3-glycidyloxypropyldimethylmethoxysilane, 2-(3,4-epoxycyclohexyl)ethyltrimethoxysilane, 3-chloropropylmethyldimethoxysilane, 3-chloropropyltrimethoxysilane, and 3-mercaptopropyltrimethoxysilane.

Examples of the antioxidant include, but are not limited to, 2,2-thiobis(4-methyl-6-t-butylphenol) and 2,6-di-t-butylphenol.

Examples of the UV absorbent include, but are not limited to, 2-(3-t-butyl-5-methyl-2-hydroxyphenyl)-5-chlorobenzotriazole and alkoxybenzophenone.

A non-limiting example of the anti-coagulant is sodium polyacrylate.

Examples of the bridging agent include, but are not limited to, epoxy compounds and resins such as 10315, and 157S-70 manufactured by Japan Epoxy Resins Co., Ltd.

Black Matrix and Preparation Thereof:

The black matrix is made by applying the photosensitive resin composition of the present invention on a substrate, followed by prebaking, exposing, developing, and postbaking.

Specifically, the black matrix is made as follows. The photosensitive resin composition is applied on a substrate by spin coating, slit coating, and the like, and is then dried under reduced pressure and prebaked to remove the solvent and to form a prebaked coating film on the substrate. The conditions for the drying under reduced pressure and the prebaking depend on the type and the formulating ratio of the components for the photosensitive resin composition. However, the drying under reduced pressure is usually conducted at a pressure less than 200 mmHg for a period ranging from 1 to 20 seconds, and the prebaking is usually conducted at a temperature ranging from 70° C. to 110° C. for a period ranging from 1 to 15 minutes. The prebaked coating film is exposed via a photomask using ultraviolet light, such as g-line, h-line, i-line, and the like. The device for providing the ultraviolet light includes a (ultra-) high pressure mercury lamp, or a metal halide lamp. The prebaked coating film after exposing is immersed in a developer solution at a temperature of 23±2° C. for a period ranging from 15 seconds to 5 minutes so as to form a desired pattern.

Examples of the developer include, but are not limited to, alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, and 1,8-diazabicyclo-[5,4,0]-7-undecene. The concentration of the developer solution ranges preferably from 0.001 wt % to 10 wt a, more preferably from 0.005 wt % to 5 wt %, and most preferably from 0.01 wt % to 1 wt %.

The developer is removed by washing with water after the development. The coating film formed on the substrate is dried with compressed air or nitrogen, and is then post-baked using a heating device, such as a hot plate or an oven. The post-baking is conducted at a temperature ranging from 150° C. to 250° C. for a period ranging from 1 to 60 minutes if the hot plate is used or for a period ranging from 5 to 90 minutes if the oven is used. A black matrix is formed on the substrate after the aforementioned process.

Examples of the substrate suitable for the present invention include alkali-free glass, soda-lime glass, Pyrex glass, quartz glass, a glass coated with a transparent conductive film thereon, and the like commonly used in a liquid crystal display; or a photoelectric conversion substrate (for example, a silicon substrate) used in a solid-state image sensor.

Color Filter and Preparation Thereof:

The color filter includes the aforesaid black matrix. The color filter according to this invention can be made in a manner commonly used in the art. For example, the aforesaid black matrix is formed on a substrate. Red, green, and blue filter segments are then formed on the substrate in the same manner as that for forming the black matrix so as to form a pixel color layer. An indium tin oxide (abbreviated as ITO) film is deposited on the pixel color layer at a temperature ranging from 220° C. to 250° C. under vacuum. The ITO film can be etched and formed with a wiring layout, if necessary. A liquid crystal alignment agent containing polyimide is then applied to form a liquid crystal alignment film. A color filter for a liquid crystal display is thus obtained.

Liquid Crystal Display and Preparation Thereof:

The liquid crystal display includes the aforesaid color filter, and can be made in a manner commonly used in the art. For example, the substrate formed with the color filter and a substrate formed with a thin film transistor are arranged to oppose each other with a space (cell gap). The peripheral portions of the two substrates are joined together with a sealing agent, liquid crystals are filled into the cell gap defined by the surfaces of the substrates and the sealing agent, and an injection hole is sealed up to form a liquid crystal cell. Then, a polarizer is affixed to the exterior sides of the liquid crystal cell to obtain the liquid crystal display device.

The following examples are provided to illustrate the preferred embodiments of the invention, and should not be construed as limiting the scope of the invention.

EXAMPLES

Preparation of Unsaturated-Group-Containing Resin (A-1)

Synthesis Example 1

A 500 ml four-necked flask was added with a fluorene epoxy compound (ESF-300 manufactured by Nippon Steel Chemical Co., epoxy equivalent: 231, 100 parts by weight), acrylic acid (30 parts by weight), benzyl triethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100° C. to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with tetrahydrophthalic anhydride (6 parts by weight) and benzophenone tetracarboxylic dianhydride (13 parts by weight). A reaction was conducted by heating at a temperature ranging from 110° C. to 115° C. for a period of 2 hours. An unsaturated-group-containing resin (A-1-1) was obtained, which had an acid value of 98.0 mgKOH/g.

Synthesis Example 2

A 500 ml four-necked flask was added with a fluorene epoxy compound (ESF-300 manufactured by Nippon Steel Chemical Co., epoxy equivalent: 231, 100 parts by weight), acrylic acid (30 parts by weight), benzyl triethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100° C. to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with benzophenone tetracarboxylic dianhydride (13 parts by weight). A reaction was conducted by heating at a temperature ranging from 90° C. to 95° C. for a period of 2 hours. Tetrahydrophthalic anhydride (6 parts by weight) was then added. A further reaction was conducted at a temperature ranging from 90° C. to 95° C. for a period of 4 hours. An unsaturated-group-containing resin (A-1-2) was obtained, which had an acid value of 99.0 mgKOH/g.

Synthesis Example 3

An epoxy compound (NC-3000 manufactured by Nippon Kayaku Co. Ltd., epoxy equivalent: 288, 400 parts by weight), acrylic acid (102 parts by weight), p-methoxyphenol (0.3 part by weight), triphenyl phosphine (5 parts by weight), and propylene glycol monomethyl ether acetate (264 parts by weight) were reacted in a reactor at a temperature of 95° C. for a period of 9 hours to obtain an intermediate product having an acid value of 2.2 mgKOH/g. Tetrahydrophthalic anhydride (151 parts by weight) was then added. A further reaction was conducted at a temperature of 95° C. for a period of 4 hours. An unsaturated-group-containing resin (A-1-3) was obtained, which had an acid value of 102 mgKOH/g and a weight average molecular weight of 3,200.

Preparation of Other Alkali-Soluble Resin (A-2)

Synthesis Example 4

A round-bottomed flask installed with a stirrer and a condenser and purged with nitrogen was added with 2,2'-azobisisobutyronitrile (1 part by weight), propylene glycol monomethyl ether acetate (240 parts by weight), methacrylic acid (20 parts by weight), styrene (15 parts by weight), benzoyl methacrylate (35 parts by weigh), glyceryl monomethyl acrylate (10 parts by weight), and N-phenyl maleimide (20 parts by weight). The temperature was raised to 80° C. with slow stirring to obtain a homogeneous mixture. A polymerization reaction was conducted for a period of 4 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-1).

Synthesis Example 5

A round-bottomed flask installed with a stirrer and a condenser and purged with nitrogen was added with 2,2'-azobisisobutyronitrile (2 parts by weight), propylene glycol monomethyl ether (300 parts by weight), methacrylic acid (15 parts by weight), 2-hydroxyethyl acrylate (15 parts by weight), and benzoyl methacrylate (70 parts by weight). The temperature was raised to 80° C. with slow stirring to obtain a homogeneous mixture. A polymerization reaction was conducted for a period of 3 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-2).

Preparation of Polysiloxane (B)

Synthesis Example 6

A 500 ml three-necked flask was added with propylene glycol monomethyl ether (100 g). Stirring was conducted at room temperature while a solution of a silane monomer mixture and an oxalic acid aqueous solution were continuously added. The solution of the silane monomer mixture was prepared by dissolving dimethyldimethoxysilane (84 g, 0.7 mole) and phenyltrimethoxy silane (59.4 g, 0.3 mole) in propylene glycol monomethyl ether (80 g). The oxalic acid aqueous solution was prepared by dissolving oxalic acid (0.15 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-1) via polycondensation. Methanol (73 g) and water (16 g) produced as by-products were separated by distillation.

Synthesis Example 7

A 500 ml three-necked flask was added with dimethyldimethoxysilane (78.0 g, 0.65 mole), phenyltrimethoxysilane (63.4 g, 0.32 mole), 3-triethoxysilylpropyl butanedioic anhydride (commercially available as GF-20, 9.1 g, 0.03 mole), and propylene glycol monoethyl ether (200 g). Stirring was conducted at room temperature while an oxalic acid aqueous solution (0.25 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 100° C. The mixture in the flask was stirred for a further 5 hours to conduct polycondensation. The reaction solution in the flask was cooled to room temperature. Acetone (2,000 g) was added and the solution in the flask was stirred for a further 30 minutes. Precipitate was removed from the solution via filtration to obtain a filtrate. The solvent contained in the filtrate was removed via distillation to obtain polysiloxane (B-2).

Synthesis Example 8

A 500 ml three-necked flask was added with propylene glycol monoethyl ether (100 g), Stirring was conducted at room temperature while a solution of a silane monomer mixture and an oxalic acid aqueous solution were continuously added. The solution of the silane monomer mixture, was prepared by dissolving methyltrimethoxysilane (81.6 g, 0.6 mole) and phenyltrimethoxysilane (79.2 g, 0.4 mole) in propylene glycol monoethyl ether (80 g). The oxalic acid aqueous solution was prepared by dissolving oxalic acid (0.1 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-3) via polycondensation. Methanol (96 g) and water (24 g) produced as by-products were separated by distillation.

Preparation of Photosensitive Resin Composition

Example 1

100 parts by weight of the unsaturated-group-containing resin (A-1-1) obtained in Synthesis Example 1, 125 parts by weight of the polysiloxane (B-1) obtained in Synthesis Example 6, 150 parts by weight of dipentaerythritol hexaacrylate (referred to as C-1), 30 parts by weight of ethanone, 1-[9-ethyl-6-(2-methylbenzoyl)$_9$H-carbazole-3-yl]-1-(O-acetyl oxime) (referred to as D-1), 20 parts by weight of 2-benzyl-2-N,N-dimethylamino-1-(4-morpholinophenyl)-1-butanone (referred to as D-2), 600 parts by weight of C.I. pigment black 7 (MA100 manufactured by Mitsubishi Chemical Corporation, referred to as F-1), 50 parts by weight of tris(ethyl acetoacetato)aluminum (referred to as G-1), 2000 parts by weight of propylene glycol monomethyl ether acetate (referred to as E-1), and 500 parts by weight of ethyl 3-ethoxypropionate (referred to as E-2) were mixed in a swing-out stirrer to obtain a homogeneous dispersion.

Examples 2 to 11 and Comparative Examples 1 to 7

Examples 2 to 11 and Comparative Examples 1 to 7 were conducted in a manner identical to that of Example 1 using the components and the amounts thereof shown in Tables 1 and 2.

The photosensitive resin compositions of Examples 1 to 11 and Comparative Examples 1 to 7 were evaluated according to the following evaluation methods. The evaluation results are shown in Tables 1 and 2.

Preparation of Black Matrix

Application Example 1

The photosensitive resin composition obtained in Example 1 was spin-coated on a glass substrate of 100 mm×100 mm using a coater (commercially available as MS-A150, from Shinkuang Trading Co., Ltd.), followed by drying in a reduced pressure of 100 mmHg for 5 seconds, and then pre-baking in an oven at a temperature of 85° C. for 3 minutes to form a prebaked film having a thickness of 2.2 μm.

The prebaked film was treated with ultra-violet irradiation using an exposure machine (Model No. AG500-4N, manufactured by M & R Nano Technology, 200 mJ/cm²) through a photo-mask. The pre-baked film after the ultra-violet irradiation was immersed in a developer (0.04% potassium hydroxide solution) at 23° C. for 2 minutes, followed by washing with water and then post-baking in an oven at 200° C. for 40 minutes to obtain a black matrix having a thickness of 2.0 μm.

Application Examples 2-11 and Comparative Application Examples 1-7

Application Examples 2 to 11 and Comparative Application Examples 1 to 7 were conducted in a manner identical to that of Application Example 1 using the components and the amounts thereof shown in Tables 1 and 2.

Evaluation Methods:

1. Ageing Stability:

Initial viscosities ($\mu_0$) of the photosensitive resin compositions obtained in Examples 1 to 11 and Comparative Examples 1 to 7 were measured under 25° C. Viscosities ($\mu_1$) were measured after a month.

Change in viscosity=$|\mu_0-\mu_1|/\mu_0 \times 100\%$ $\mu_0$: initial viscosity;
$\mu_1$: viscosity after one month of placement;
◯: change in viscosity ≤5%;
Δ: 5%<change in viscosity ≤8%; and
X: change in viscosity >8%.

2. Adhesion after Heating:

The photosensitive resin compositions obtained in Examples 1 to 11 and Comparative Examples 1 to 7 were separately spin-coated on glass substrates of 100 mm×100 mm using a coater (commercially available as MS-A150, from Shinkuang Trading Co., Ltd.), followed by drying in a reduced pressure of 100 mmHg for 5 seconds, and then pre-baking in an oven at a temperature of 100° C. for 2 minutes to form a prebaked film having a thickness of 1.2 μm.

The prebaked films were then treated with ultra-violet irradiation using an exposure machine (Model No. AG500-4N, manufactured by M & R Nano Technology, 100 mJ/cm²) through a photo-mask. The pre-baked films after the ultra-violet irradiation were immersed in a developer (0.04% potassium hydroxide solution) at 23° C. for a period ranging from 30 seconds to 120 seconds, followed by washing with water and then post-baking in an oven at 240° C. for 30 minutes to obtain black matrices having a thickness of 1.0 μm. The black matrices were then baked in an oven at 300° C. for 60 minutes.

According to JIS.5400 (1900)8.5.2 standard, the black matrices were each scratched with a cross-cut tester to form 100 lattice patterns. A tape was then applied to the black matrices to see how many lattice patterns were detached from the black matrices.

◉: 5B;
◯: 4B;
Δ: 3B to 2B; and
X: 1B to 0B;
wherein
5B: no pattern detachment;
4B: 0%<pattern detachment percentage ≤5%;
3B: 5%<pattern detachment percentage ≤15%;
2B: 15%<pattern detachment percentage ≤35%;
1B: 35%<pattern detachment percentage ≤65%;
0B: 65%<pattern detachment percentage ≤100%.

TABLE 1

| Components Parts by weight | | Examples | | | | | | | | |
|---|---|---|---|---|---|---|---|---|---|---|
| | | 1 | 2 | 3 | 4 | 5 | 6 | 7 | 8 | 9 |
| Alkali-soluble Resin (A) | A-1-1 | 100 | — | — | — | 100 | — | — | 70 | — |
| | A-1-2 | — | 100 | — | 100 | — | 30 | — | — | — |
| | A-1-3 | — | — | 100 | — | — | — | 50 | — | 100 |
| | A-2-1 | — | — | — | — | — | 70 | — | 30 | — |
| | A-2-2 | — | — | — | — | — | — | 50 | — | — |
| Polysiloxane (B) | B-1 | 125 | — | — | — | 10 | — | — | — | 25 |
| | B-2 | — | 100 | — | 20 | — | 5 | — | 40 | — |
| | B-3 | — | — | 50 | — | — | — | 20 | — | 5 |
| Ethylenically Unsaturated Compound (C) | C-1 | 150 | 90 | 90 | 60 | 30 | 5 | 60 | 60 | 90 |
| | C-2 | — | 30 | — | — | — | 30 | 5 | 30 | — |
| Photo-initiator (D) | D-1 | 30 | 30 | 20 | 20 | 10 | 10 | 20 | 30 | 30 |
| | D-2 | 20 | — | 5 | — | 5 | — | 10 | — | 5 |
| Solvent (E) | E-1 | 2000 | 2000 | 1500 | 1500 | 500 | 1000 | 2000 | 3000 | 2000 |
| | E-2 | 500 | — | — | — | 500 | 500 | — | — | 500 |
| Black Pigment (F) | F-1 | 600 | — | 400 | 300 | 250 | 50 | 300 | 500 | 300 |
| | F-2 | — | 500 | — | — | — | — | 200 | — | 100 |
| Metal Chelate (G) | G-1 | 50 | — | — | — | — | 1 | 20 | — | 5 |
| | G-2 | — | 35 | — | — | — | — | — | 5 | — |
| | G-3 | — | — | 20 | — | — | — | — | — | 5 |
| | G-4 | — | — | — | 10 | — | — | 5 | — | — |
| | G-5 | — | — | — | — | 5 | — | — | 20 | — |

TABLE 1-continued

| Components | | Examples | | | | | | | | |
|---|---|---|---|---|---|---|---|---|---|---|
| Parts by weight | | 1 | 2 | 3 | 4 | 5 | 6 | 7 | 8 | 9 |
| (A-1)/(B) Ratio | | 0.80 | 1.00 | 2.00 | 5.00 | 10.00 | 6.00 | 2.50 | 1.75 | 3.33 |
| Evaluation results | Ageing Stability | ○ | ○ | ○ | ○ | ○ | ○ | ○ | ○ | ○ |
| | Adhesion | ◎ | ◎ | ◎ | ◎ | ◎ | ◎ | ◎ | ◎ | ◎ |

C-1: dipentaerythritol hexaacrylate;
C-2: dipentaerythritol tetraacrylate;
D-1: ethanone, 1-[9-ethyl-6-(2-methylbenzoyl)9H-carbazole-3-yl]-1-(O-acetyl oxime);
D-2: 2-benzyl-2-N,N-dimethylamino-1-(4-morpholinophenyl)-1-butanone;
E-1: propylene glycol monomethyl ether acetate;
E-2: ethyl 3-ethoxypropionate;
F-1: MA100 manufactured by Mitsubishi Chemical Corporation;
F-2: MA230 manufactured by Mitsubishi Chemical Corporation;
G-1: tris(ethyl acetoacetato) aluminum;
G-2: di-i-propoxy bisacetylacetonato zirconium;
G-3: di-n-butoxy bis(triethanolamine) titanium;
G-4: isopropyl tris(dodecylbenzenesulfonyl) titanate; and
G-5: tetraisopropyl bis(dioctyl phosphate) titanate.

TABLE 2

| Components | | Examples | | Comparative Examples | | | | | | |
|---|---|---|---|---|---|---|---|---|---|---|
| Parts by weight | | 10 | 11 | 1 | 2 | 3 | 4 | 5 | 6 | 7 |
| Alkali-soluble Resin (A) | A-1-1 | — | 70 | 100 | — | — | — | — | — | — |
| | A-1-2 | 100 | — | — | — | 100 | — | 100 | — | — |
| | A-1-3 | — | — | — | — | — | — | — | — | — |
| | A-2-1 | — | 30 | — | 100 | — | 100 | — | — | 100 |
| | A-2-2 | — | — | — | — | — | — | — | 100 | — |
| Polysiloxane (B) | B-1 | — | 5 | — | 100 | — | — | — | — | — |
| | B-2 | 100 | — | — | — | 100 | — | — | — | — |
| | B-3 | 50 | — | — | — | — | 100 | — | — | — |
| Ethylenically Unsaturated Compound (C) | C-1 | 120 | 60 | 60 | 30 | 60 | — | 60 | 50 | — |
| | C-2 | — | 30 | — | 30 | — | 60 | 5 | — | 50 |
| Photo-initiator (D) | D-1 | 30 | 20 | 20 | 20 | 15 | 25 | 30 | 15 | 10 |
| | D-2 | 10 | — | — | 5 | 5 | — | — | — | 5 |
| Solvent (E) | E-1 | 2500 | 1000 | 2500 | 2500 | 3000 | 2000 | 2000 | 1500 | 2000 |
| | E-2 | 500 | 1000 | — | 500 | — | 1000 | — | 500 | — |
| Black Pigment (F) | F-1 | 800 | 200 | 300 | 500 | — | 200 | 500 | — | 300 |
| | F-2 | — | — | — | — | 300 | 300 | — | 300 | — |
| Metal Chelate (G) | G-1 | — | 10 | 20 | — | — | — | — | — | — |
| | G-2 | 30 | — | — | 10 | — | — | — | — | — |
| | G-3 | — | 5 | — | — | — | — | — | — | — |
| | G-4 | — | — | — | — | — | — | — | — | — |
| | G-5 | — | — | — | — | — | — | — | 10 | — |
| (A-1)/(B) Ratio | | 0.67 | 14.00 | — | 0 | 1 | 0 | — | — | — |
| Evaluation results | Ageing Stability | ○ | ○ | ○ | ○ | X | X | X | ○ | X |
| | Adhesion | ○ | ○ | X | X | X | X | X | X | X |

C-1: dipentaerythritol hexaacrylate;
C-2: dipentaerythritol tetraacrylate;
D-1: ethanone, 1-[9-ethyl-6-(2-methylbenzoyl)9H-carbazole-3-yl]-1-(O-acetyl oxime);
D-2: 2-benzyl-2-N,N-dimethylamino-1-(4-morpholinophenyl)-1-butanone;
E-1: propylene glycol monomethyl ether acetate;
E-2: ethyl 3-ethoxypropionate;
F-1: MA100 manufactured by Mitsubishi Chemical Corporation;
F-2: MA230 manufactured by Mitsubishi Chemical Corporation;
G-1: tris(ethyl acetoacetato) aluminum;
G-2: di-i-propoxy bisacetylacetonato zirconium;
G-3: di-n-butoxy bis(triethanolamine) titanium;
G-4: isopropyl tris(dodecylbenzenesulfonyl) titanate; and
G-5: tetraisopropyl bis(dioctyl phosphate) titanate.

As shown in Table 1, the photosensitive resin compositions obtained in Examples 1 to 11 have superior ageing stability and the black matrices formed therefrom have better adhesion after heating by simultaneously using the unsaturated-group-containing resin (A-1), the polysiloxane (B), and the metal chelate (G) in the photosensitive resin compositions.

The polysiloxane (B) was not used in forming the photosensitive resin composition in the Comparative Example 1. The black matrix thus formed from the photosensitive resin composition has inferior adhesion after heating.

The unsaturated-group-containing resin (A-1) was not used in forming the photosensitive resin composition in the Comparative Example 2. The black matrix thus formed from the photosensitive resin composition has inferior adhesion after heating.

The metal chelate (G) was not used in forming the photosensitive resin composition in the Comparative Example 3. The photosensitive resin composition has deteriorated ageing stability. The black matrix thus formed from the photosensitive resin composition has inferior adhesion after heating.

The unsaturated-group-containing resin (A-1), the polysiloxane (B), and the metal chelate (G) were not used simultaneously in the Comparative Examples 4, 5, and 7. The photosensitive resin compositions have deteriorated ageing stability. The black matrices thus formed from the photosensitive resin compositions have inferior adhesion after heating.

The unsaturated-group-containing resin (A-1) and the polysiloxane (B) were not used in the Comparative Example 6. Although the photosensitive resin compositions have better ageing stability, the black matrices thus formed from the photosensitive resin compositions still have inferior adhesion after heating.

In view of the aforesaid, the photosensitive resin composition has better ageing stability and the black matrix formed from the photosensitive resin composition can have superior adhesion after heating when the unsaturated-group-containing resin (A-1), the polysiloxane (B), and the metal chelate (G) are all used.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photosensitive resin composition, comprising:
   (A) an alkali-soluble resin including an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization;
   (B) a polysiloxane;
   (C) an ethylenically unsaturated compound;
   (D) a photo-initiator;
   (E) a solvent;
   (F) a black pigment; and
   (G) a metal chelate;
   wherein said polysiloxane (B) is obtained by subjecting a silane monomer or a combination of said silane monomer and a siloxane prepolymer to hydrolysis and partial condensation, and said silane monomer is represented by formula (V):

$$SiR^{21}_m(OR^{22})_{4-m} \quad (V),$$

wherein m is an integer ranging from 1 to 3,
   $R^{21}$ independently represents a hydrogen, a substituted or unsubstituted C1-C10 alkyl group, a substituted or unsubstituted C2-C10 alkenyl group, or a substituted or unsubstituted C6-C15 aryl group, and wherein at least one of $R^{21}$ is selected from the group consisting of 3-glutaric anhydride propyl, 3-butanedioic anhydride propyl, and 2-butanedioic anhydride ethyl, and $R^{22}$ independently represents a hydrogen, a substituted or unsubstituted C1-C6 alkyl group, a substituted or unsubstituted C1-C6 acyl group, or a substituted or unsubstituted C6-C15 aryl group.

2. The photosensitive resin composition according to claim 1, wherein said metal chelate (G) is represented by formula (III):

$$(R^{29})_p M(OR^{30})_{j-p} \quad (III)$$

wherein
   M is a metal,
   $R^{29}$ is a chelating ligand;
   $R^{30}$ is selected from the group consisting of a C2-C5 alkyl group and a C6-C20 aryl group,
   j is a valence number of said metal,
   p is an integer ranging from 1 to j,
   a plurality of $R^{29}$s are the same or different when p is greater than 1, and
   a plurality of $R^{30}$s are the same or different when j-p is greater than 1.

3. The photosensitive resin composition according to claim 2, wherein said metal is selected from the group consisting of aluminum, titanium, and zirconium.

4. The photosensitive resin composition according to claim 2, wherein said chelating ligand is selected from the group consisting of a β-diketone based chelating ligand, a β-ketone ester based chelating ligand, an amine based chelating ligand, a sulfonic acid based chelating ligand, and a phosphate based chelating ligand.

5. The photosensitive resin composition according to claim 1, wherein a weight ratio of said unsaturated-group-containing resin (A-1) to said polysiloxane (B) ranges from 0.8 to 10.0.

6. The photosensitive resin composition according to claim 1, wherein said epoxy compound (i) is represented by formula (I):

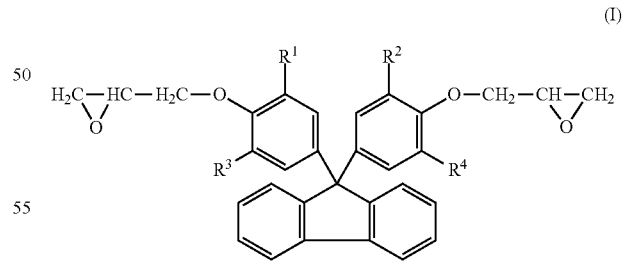

wherein R1, R2, R3, and R4 are independently selected from the group consisting of hydrogen, halogen, a C1-C5 alkyl group, a C1-C5 alkoxy group, a C6-C12 aryl group, and a C6-C12 aralkyl group.

7. The photosensitive resin composition according to claim 1, wherein said epoxy compound (i) is represented by formula (II):

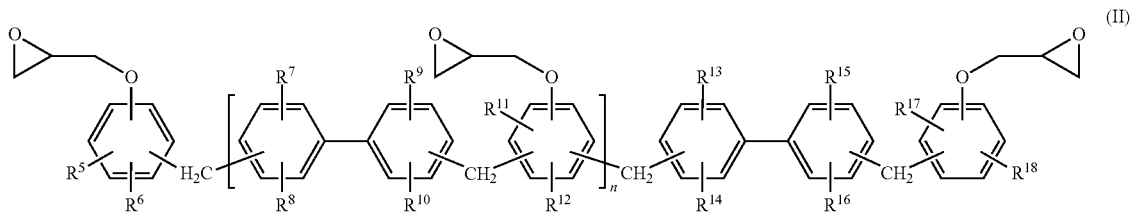

(II)

wherein $R^5$-$R^{18}$ are independently selected from the group consisting of hydrogen, halogen, a C1-C8 alkyl group, and a C6-C15 aryl group; and n represents an integer ranging from 0 to 10.

8. The photosensitive resin composition according to claim 1, wherein said unsaturated-group-containing resin (A-1) is in an amount ranging from 30 to 100 parts by weight, said polysiloxane (B) is in an amount ranging from 5 to 150 parts by weight, said ethylenically unsaturated compound (C) is in an amount ranging from 5 to 220 parts by weight, said solvent (E) is in an amount ranging from 500 to 5,000 parts by weight, said black pigment (F) is in an amount ranging from 50 to 800 parts by weight, and said metal chelate is in an amount ranging from 1 to 50 parts by weight based on 100 parts by weight of said alkali-soluble resin (A).

9. The photosensitive resin composition according to claim 1, wherein said photo-initiator (D) is in an amount ranging from 2 to 120 parts by weight based on 100 parts by weight of said ethylenically unsaturated compound (C).

10. A black matrix formed from the photosensitive resin composition according to claim 1.

11. A color filter comprising the black matrix according to claim 10.

12. A liquid crystal display device comprising the color filter according to claim 11.

* * * * *